US 9,847,777 B2

(12) United States Patent
Ebuchi et al.

(10) Patent No.: US 9,847,777 B2
(45) Date of Patent: Dec. 19, 2017

(54) SIGNAL POTENTIAL CONVERTER (71) Applicant: SOCIONEXT INC., Kanagawa (JP)

(72) Inventors: Tsuyoshi Ebuchi, Osaka (JP); Seiji Watanabe, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/185,781

(22) Filed: Jun. 17, 2016

(65) Prior Publication Data

US 2016/0294372 A1 Oct. 6, 2016

Related U.S. Application Data (63) Continuation of application No. PCT/JP2014/006258, filed on Dec. 16, 2014.

(30) Foreign Application Priority Data

Dec. 25, 2013 (JP) ................. 2013-267929

(51) Int. Cl.
*H03K 5/08* (2006.01)
*H03K 19/0185* (2006.01)
(Continued)

(52) U.S. Cl.
CPC ......... *H03K 5/08* (2013.01); *H03K 19/00361* (2013.01); *H03K 19/0175* (2013.01); *H03K 3/356* (2013.01); *H03K 19/0185* (2013.01)

(58) Field of Classification Search
CPC ............ H03K 5/08; H03K 19/00361; H03K 19/0175; H03K 19/017509; H03K 19/0185–19/018528
See application file for complete search history.

(56) References Cited

U.S. PATENT DOCUMENTS 6,124,756 A 9/2000 Yaklin et al.
8,035,424 B2 * 10/2011 Komatsu ............ H04L 25/0266
327/108
(Continued)

FOREIGN PATENT DOCUMENTS

JP H10-32483 A 2/1998
JP 2004-205957 A 7/2004
(Continued)

OTHER PUBLICATIONS

Innternational Search Report issued in corresponding International Patent Application No. PCT/JP2014/006258, dated Mar. 24, 2015; with English translation.

*Primary Examiner* — Patrick O'Neill
(74) *Attorney, Agent, or Firm* — McDermott Will & Emery LLP (57) ABSTRACT

Disclosed herein is a signal potential converter which may perform high-speed operation and which may still maintain intended signal amplitude and operate normally even while operating at a low rate or receiving a burst signal. In this signal potential converter, a capacitor receives an input signal CIN at one terminal thereof and has the other terminal thereof connected to a terminal node. A clamp circuit defines a potential at the terminal node, i.e., a signal IN, within the range of a first potential to a second potential. If a potential at the terminal node is higher than a third potential, a voltage holder circuit operates to raise the potential at the terminal node. If the potential at the terminal node is lower than the third potential, the voltage holder circuit operates to lower the potential at the terminal node.

7 Claims, 8 Drawing Sheets

(51) Int. Cl.
*H03K 19/0175* (2006.01)
*H03K 19/003* (2006.01)
*H03K 3/356* (2006.01)

(56) References Cited

U.S. PATENT DOCUMENTS

| | | | | |
|---|---|---|---|---|
| 8,884,680 | B2* | 11/2014 | Iwata | H03K 19/01852 327/333 |
| 8,890,565 | B2* | 11/2014 | Honda | H03K 19/01852 326/30 |
| 9,584,103 | B2* | 2/2017 | Watanabe | H03K 19/0185 |
| 2004/0125102 | A1 | 7/2004 | Sato et al. | |
| 2006/0197554 | A1 | 9/2006 | Jinta | |
| 2014/0043084 | A1 | 2/2014 | Iwata | |

FOREIGN PATENT DOCUMENTS

| | | |
|---|---|---|
| JP | 2006-279918 A | 10/2006 |
| WO | 2012/157031 A1 | 11/2012 |

* cited by examiner

SIGNAL POTENTIAL CONVERTER

CROSS-REFERENCE TO RELATED APPLICATION

This is a continuation of International Application No. PCT/JP2014/006258 filed on Dec. 16, 2014, which claims priority to Japanese Patent Application No. 2013-267929 filed on Dec. 25, 2013. The entire disclosures of these applications are hereby incorporated by reference.

BACKGROUND

The present disclosure relates to a signal potential converter for converting the potential of an input signal to pass a signal having a different potential.

As the feature size of transistors has been further reduced lately, their operating voltage has become lower and lower year after year. As for external interfaces, on the other hand, their operating voltage is rated in advance in accordance with a standard. Therefore, integrated circuits need to operate at an operating voltage of 5 V or 3.3 V, for example, so as to be connectible to existing devices as well. Thus, a level shifter (signal potential converter) is used to arbitrate between a signal to be driven by a micro-transistor and a signal to be driven at e.g., 5 V or 3.3 V. To transmit a signal at high speeds, in particular, an AC coupler using a capacitor may be used effectively.

PCT International Application Publication No. 2012/157031 discloses a configuration for reducing attenuation of a potential at a terminal node of a signal potential converter so as to prevent jitter from being produced in the converted signal.

Recently, there have been increasing demands for hybrid cores compatible with a plurality of interface standards. A single core may be required to operate sometimes at as high a rate as several gigabits per second (Gbps) and sometimes at a rate low enough to receive a burst signal representing data that does not change for a long time. If a signal potential converter such as the one disclosed in PCT International Application Publication No. 2012/157031 is used as such a core, the signal potential converter can certainly perform the high-speed operation. However, if the signal potential converter needs to operate at a low rate or receive a burst signal, the capacitor will be gradually discharged too much to maintain intended signal amplitude and always ensure normal operation.

Thus, the present disclosure provides a signal potential converter which may perform high-speed operation and which may still maintain intended signal amplitude and operate normally even while operating at a low rate or receiving a burst signal.

SUMMARY

A signal potential converter according to an aspect of the present disclosure includes: a capacitor, one terminal of which receives an input signal and the other terminal of which is connected to a terminal node; a clamp circuit configured to receive a potential at the terminal node; and a voltage holder circuit connected to the terminal node. The clamp circuit includes: a first connection element provided between a first power supply and the terminal node; and a second connection element provided between the terminal node and a second power supply having a lower supply voltage than the first power supply. The impedance of the first connection element decreases when the potential at the terminal node becomes lower than a first potential that is higher than the supply voltage of the second power supply. The impedance of the second connection element decreases when the potential at the terminal node becomes higher than a second potential that is lower than the supply voltage of the first power supply and higher than the first potential. The voltage holder circuit operates to raise the potential at the terminal node if the potential at the terminal node is higher than a third potential that is higher than the first potential and lower than the second potential, and operates to lower the potential at the terminal node if the potential at the terminal node is lower than the third potential.

According to this aspect, the clamp circuit defines a potential at the terminal node within the range of a first potential to a second potential. Also, the potential at the terminal node is raised by the voltage holder circuit when higher than a third potential, and lowered by the voltage holder circuit when lower than the third potential. That is why even if the capacitor is gradually discharged when the converter is operating at a low rate or receiving a burst signal, the fall or rise in potential at the terminal node is reduced by the voltage holder circuit. Thus, the intended signal amplitude may be maintained.

A signal potential converter according to another aspect of the present disclosure includes: a first capacitor, one terminal of which receives a positive signal that is one of two signals forming a differential signal pair and the other terminal of which is connected to a first terminal node; a first clamp circuit configured to receive a potential at the first terminal node; a second capacitor, one terminal of which receives a negative signal that is the other of the two signals forming the differential signal pair and the other terminal of which is connected to a second terminal node; a second clamp circuit configured to receive a potential at the second terminal node; and a differential voltage holder circuit connected to the first and second terminal nodes. The first clamp circuit includes: a first connection element provided between a first power supply and the first terminal node; and a second connection element provided between the first terminal node and a second power supply having a lower supply voltage than the first power supply. The impedance of the first connection element decreases when the potential at the first terminal node becomes lower than a first potential that is higher than the supply voltage of the second power supply. The impedance of the second connection element decreases when the potential at the first terminal node becomes higher than a second potential that is lower than the supply voltage of the first power supply and higher than the first potential. The second clamp circuit includes: a third connection element provided between the first power supply and the second terminal node; and a fourth connection element provided between the second terminal node and the second power supply. The impedance of the third connection element decreases when the potential at the second terminal node becomes lower than the first potential. The impedance of the fourth connection element decreases when the potential at the second terminal node becomes higher than the second potential. The differential voltage holder circuit operates to raise the potential at the first terminal node and lower the potential at the second terminal node if the potential at the first terminal node is higher than the potential at the second terminal node, and operates to lower the potential at the first terminal node and raise the potential at the second terminal node if the potential at the first terminal node is lower than the potential at the second terminal node.

According to this aspect, the first and second clamp circuits define respective potentials at the first and second terminal nodes within the range of a first potential to a second potential. Also, the potentials at the first and second terminal nodes are respectively raised and lowered by the differential voltage holder circuit if the potential at the first terminal node is higher than the potential at the second terminal node. On the other hand, the potentials at the first and second terminal nodes are respectively lowered and raised by the differential voltage holder circuit if the potential at the first terminal node is lower than the potential at the second terminal node. That is why even if the first and second capacitors are gradually discharged when the converter is operating at a low rate or receiving a burst signal, the fall or rise in potential at the first and second terminal nodes is reduced by the differential voltage holder circuit. Thus, the amplitude of the differential signal pair may be maintained.

The present disclosure provides a signal potential converter which may perform high-speed operation and which may still maintain intended signal amplitude even while operating at a low rate or receiving a burst signal.

DETAILED DESCRIPTION

In the following description of embodiments, a power supply and its supply voltage will be identified by the same reference sign unless there is any problem, in particular.

First Embodiment

Figure 1:
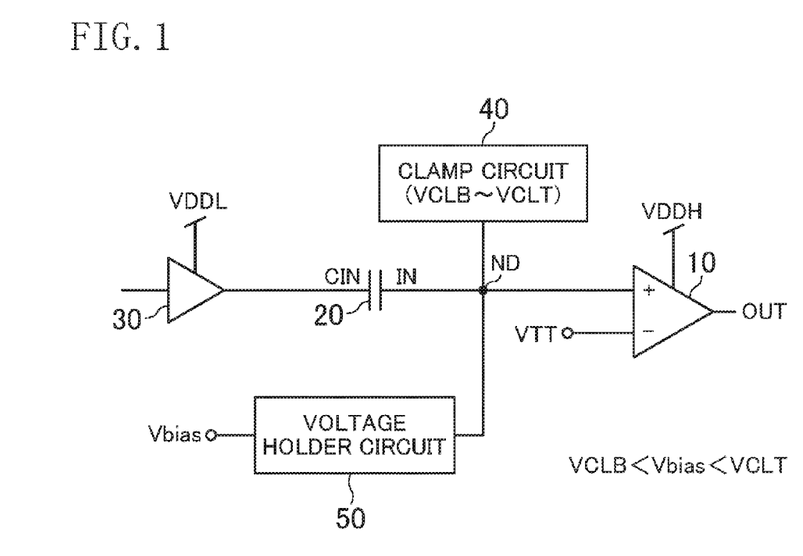
FIG. 1 illustrates a configuration for a signal potential converter according to a first embodiment.

FIG. 1 illustrates a circuit configuration for a signal potential converter according to a first embodiment and other circuits preceding and following the signal potential converter. The signal potential converter shown in FIG. 1 utilizes AC coupling. As shown in FIG. 1, a receiver circuit 10 receives a signal IN at a terminal node ND and generates an output signal OUT. A capacitor 20 receives an input signal CIN at one terminal thereof and has the other terminal thereof connected to the terminal node ND. A signal driver circuit 30 drives the input signal CIN. A clamp circuit 40 receives the potential at the terminal node ND (i.e., the signal IN). A voltage holder circuit 50 is connected to the terminal node ND. The signal potential converter of this embodiment includes the capacitor 20, the clamp circuit 40, and the voltage holder circuit 50.

Figure 2:
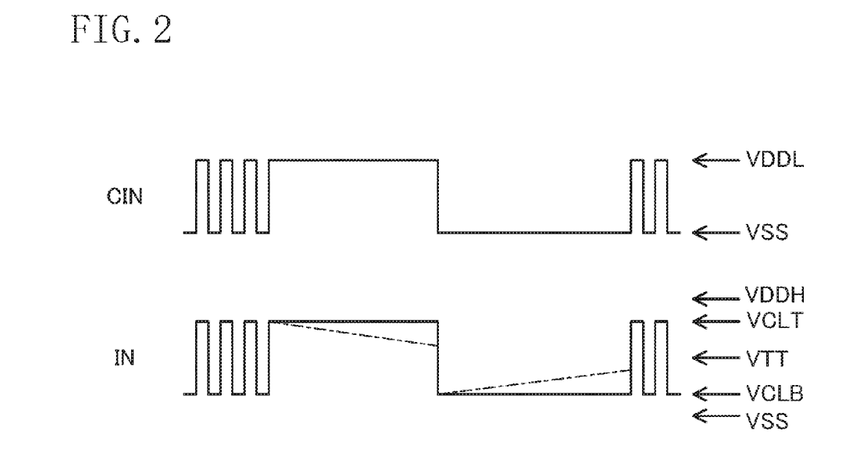
FIG. 2 is a timing chart illustrating how the signal potential converter shown in FIG. 1 operates.

FIG. 2 is a timing chart illustrating how the signal potential converter shown in FIG. 1 operates.

The signal driver circuit 30 is supplied with a supply voltage VDDL, and outputs a signal CIN having amplitude VDDL. The receiver circuit 10 is supplied with a supply voltage VDDH, and amplifies the potential of the signal IN with respect to a reference potential VTT, thereby generating an output signal OUT having amplitude VDDH. To allow the receiver circuit 10 to operate normally, the signal IN needs to have its amplitude centered around the reference potential VTT.

The clamp circuit 40 has the function of changing the signal potential such that the signal IN has such amplitude centered around the reference potential VTT. That is to say, the clamp circuit 40 raises the potential of the signal IN if the signal IN becomes lower than a potential VCLB, and lowers the potential of the signal IN if the signal IN becomes higher than a potential VCLT (>VCLB). The clamp circuit 40 includes: a first connection element provided between a power supply VDDH and the terminal node ND; and a second connection element provided between the terminal node ND and a power supply VSS (where VSS<VDDH). The impedance of the first connection element decreases when the potential at the terminal node ND becomes lower than a potential VCLB (>VSS) serving as a first potential. The impedance of the second connection element decreases when the potential at the terminal node ND becomes higher than a potential VCLT (<VDDH) serving as a second potential.

If a potential at the terminal node ND (i.e., the potential of the signal IN) is higher than a potential Vbias serving as a third potential, the voltage holder circuit 50 operates to raise the potential at the terminal node ND. If the potential at the terminal node ND is lower than the potential Vbias, the voltage holder circuit 50 operates to lower the potential at the terminal node ND. The potential Vbias is higher than the potential VCLB and lower than the potential VCLT (i.e., VSS<VCLB<Vbias<VCLT<VDDH is satisfied).

Without the voltage holder circuit 50, if the converter is operating at a low rate or receiving a burst signal representing data that does not change for a long time, the signal level changes gradually as indicated by the one-dot chains in FIG. 2. The reason is that the electric charge stored in the capacitor 20 is lost little by little via an element connected to the capacitor 20. As a result, the intended signal amplitude cannot be maintained and it is difficult to allow the converter to operate normally.

In contrast, according to this embodiment, the voltage holder circuit 50 operates so as to reduce the change in the signal level. Also, even in a situation where the voltage holder circuit 50 is operating to raise the potential at the terminal node ND, once the potential at the terminal node ND reaches the potential VCLT, the potential VCLT will be maintained after that by the clamp circuit 40.

As can be seen, according to this embodiment, the converter may also operate normally even while operating at a low rate or receiving a burst signal. Thus, the converter may operate both at high speeds and at low speeds depending on the situation.

Figure 3:
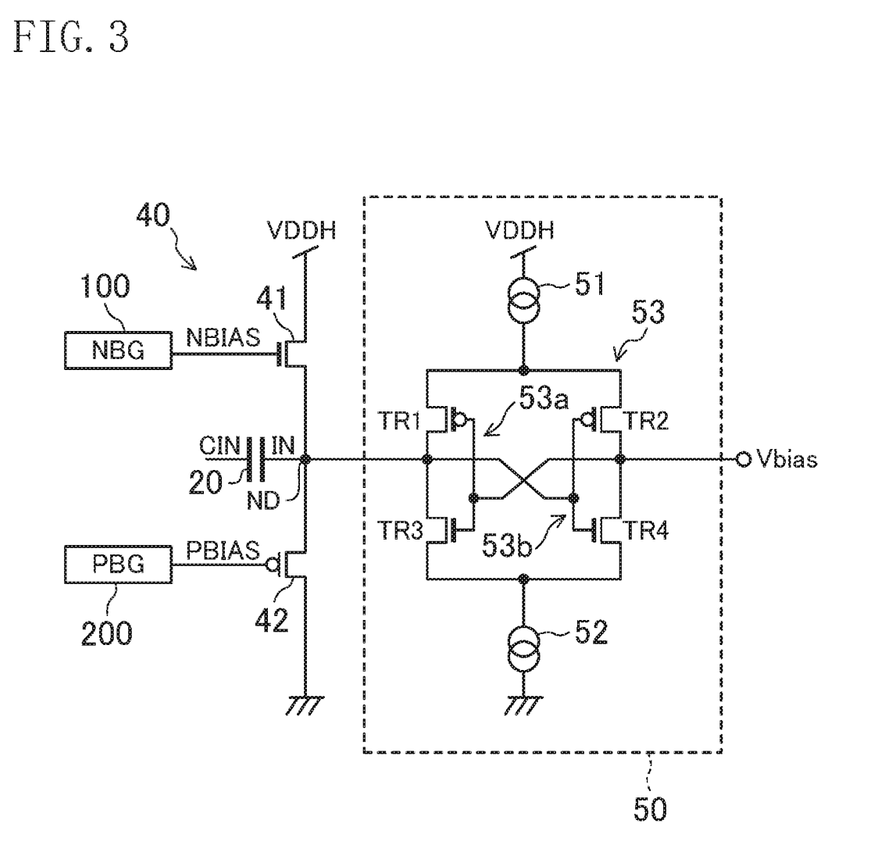
FIG. 3 illustrates an exemplary configuration for the voltage holder circuit shown in FIG. 1.
Figure 4:
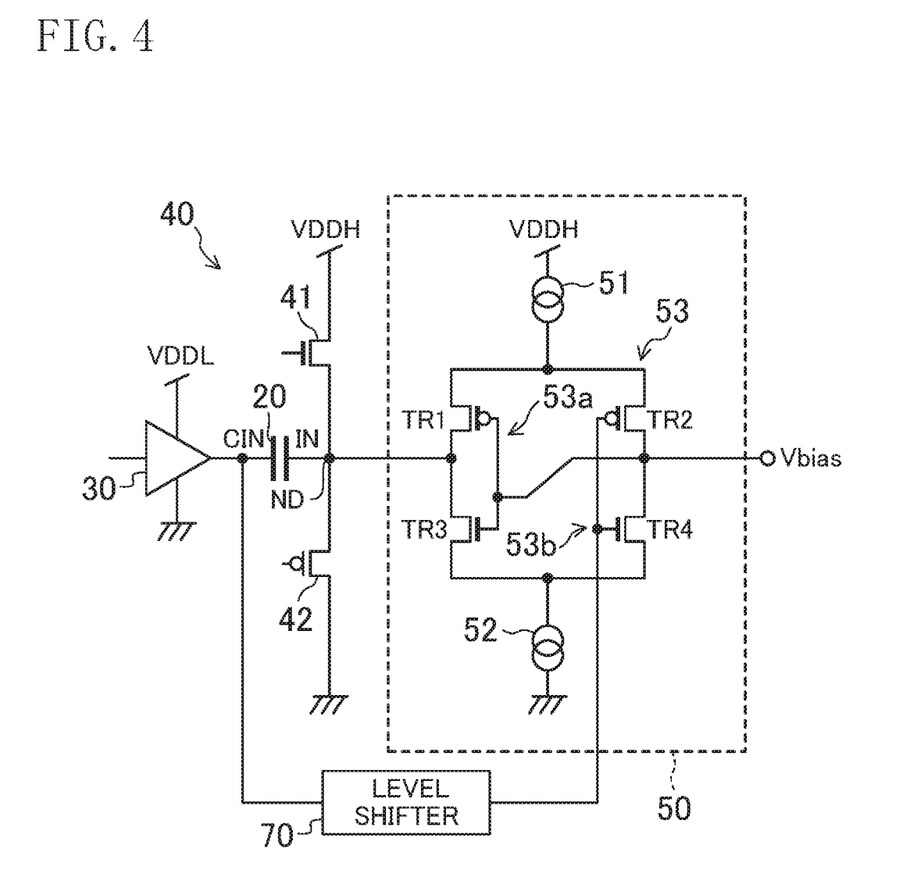
FIG. 4 illustrates another exemplary configuration for the voltage holder circuit shown in FIG. 1.
Figure 5:
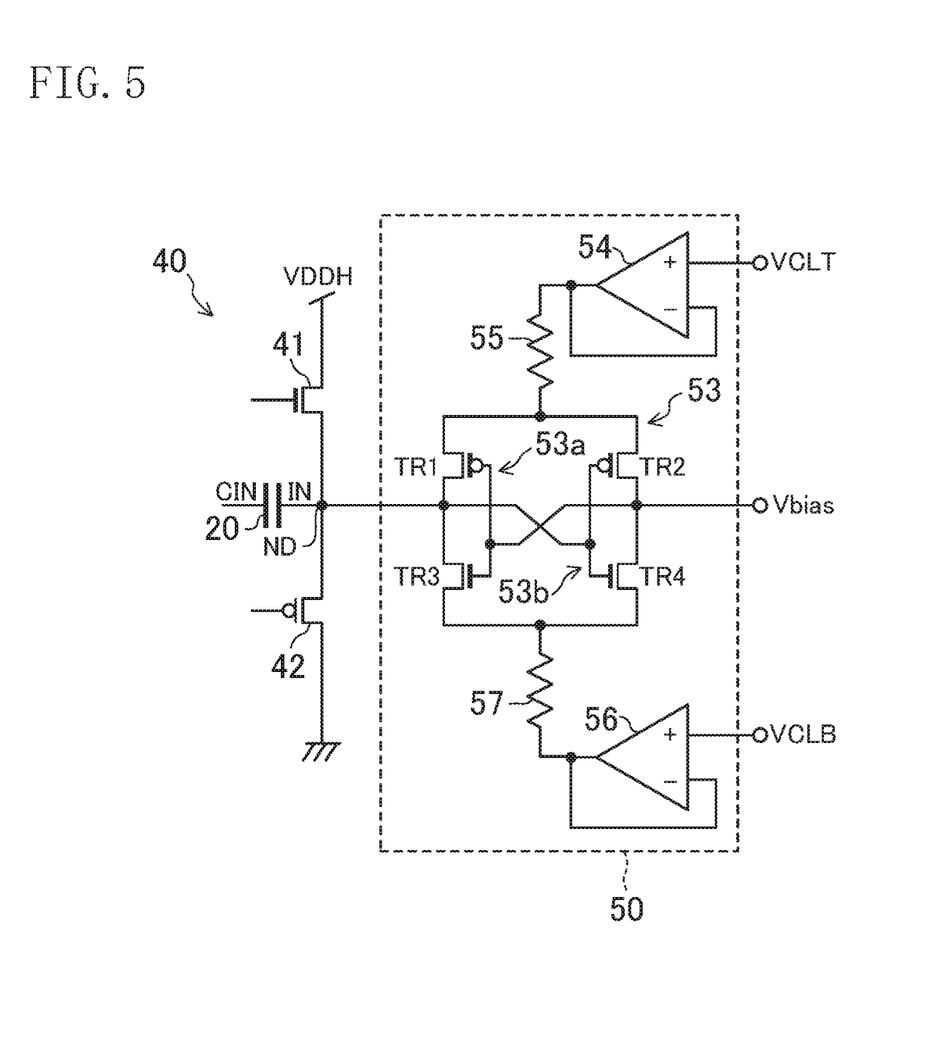
FIG. 5 illustrates still another exemplary configuration for the voltage holder circuit shown in FIG. 1.

FIG. 3 illustrates an exemplary configuration for the voltage holder circuit 50 shown in FIG. 1. In FIGS. 3-5, the clamp circuit 40 includes an NMOS transistor 41 having its drain and source connected to a power supply VDDH functioning as a first power supply and the terminal node ND, respectively, and a PMOS transistor 42 having its drain and source connected to a ground power supply VSS functioning as a second power supply and the terminal node ND, respectively. That is to say, in this embodiment, the clamp circuit 40 includes the NMOS transistor 41 functioning as a first connection element and the PMOS transistor 42 functioning as a second connection element. Also, control potentials NBIAS and PBIAS generated by control potential generator circuits 100, 200, respectively, are applied to the respective gates of the NMOS and PMOS transistors 41, 42. In this embodiment, the control potentials NBIAS and PBIAS are controlled as shown in FIG. 2 such that the NMOS transistor 41 turns ON when the potential of the signal IN becomes lower than VCLB and that the PMOS transistor 42 turns ON when the potential of the signal IN becomes higher than VCLT. Note that the configuration and operation of the control potential generator circuits 100, 200 are described in detail in PCT International Application Publication No. 2012/157031, for example, and description thereof will be omitted herein.

In this embodiment, the terminal node ND is supposed to be terminated with the NMOS and PMOS transistors 41, 42. However, this is only a non-limiting exemplary embodiment. For example, any other connection element may replace the NMOS transistor 41 as long as its impedance falls when the potential at the terminal node ND becomes lower than VCLB. Likewise, any other connection element may replace the PMOS transistor 42 as long as its impedance falls when the potential at the terminal node ND becomes higher than VCLT.

The voltage holder circuit 50 shown in FIG. 3 includes: a first current source 51 connected to the power supply VDDH; a second current source 52 connected to the ground power supply VSS; and a cross-latched circuit section 53 provided between the first and second current sources 51, 52. The cross-latched circuit section 53 receives the potential at the terminal node ND and the potential Vbias.

The cross-latched circuit section 53 includes PMOS transistors TR1, TR2 and NMOS transistors TR3, TR4. The PMOS transistor TR1 and the NMOS transistor TR3 have their respective gates connected in common and their respective drains connected in common, thus forming a first inverter circuit section 53a. The PMOS transistor TR2 and the NMOS transistor TR4 have their respective gates connected in common and their respective drains connected in common, thus forming a second inverter circuit section 53b. The common gate and common drain of the PMOS and NMOS transistors TR1, TR3 respectively correspond to input and output terminals of the first inverter circuit section 53a. The common gate and common drain of the PMOS and NMOS transistors TR2, TR4 respectively correspond to input and output terminals of the second inverter circuit section 53b. The output terminal of the first inverter circuit section 53a and the input terminal of the second inverter circuit section 53b are connected to the terminal node ND. The potential Vbias is applied to the input terminal of the first inverter circuit section 53a and the output terminal of the second inverter circuit section 53b.

Next, it will be described how the voltage holder circuit 50 shown in FIG. 3 operates. If the potential at the terminal node ND (i.e., the potential of the signal IN) is higher than the potential Vbias, the PMOS and NMOS transistors TR1, TR4 become conductive, whereas the PMOS and NMOS transistors TR2, TR3 become non-conductive. In this case, a current flows from the power supply VDDH toward the terminal node ND via the PMOS transistor TR1. This current serves to retain the electric charge stored in the capacitor 20 and raise the potential at the terminal node ND. As a result, the potential of the signal IN may be kept from falling.

On the other hand, if the potential at the terminal node ND (i.e., the potential of the signal IN) is lower than the potential Vbias, the PMOS and NMOS transistors TR1, TR4 become non-conductive, whereas the PMOS and NMOS transistors TR2, TR3 become conductive. In this case, a current flows from the terminal node ND toward the ground power supply VSS via the NMOS transistor TR3. This current serves to retain the electric charge stored in the capacitor 20 and lower the potential at the terminal node ND. As a result, the potential of the signal IN may be kept from rising.

As can be seen, the voltage holder circuit 50 shown in FIG. 3 operates to raise the potential at the terminal node ND if the potential at the terminal node ND is higher than the potential Vbias, and to lower the potential at the terminal node ND if the potential at the terminal node ND is lower than the potential Vbias. This voltage holder circuit 50 may also switch at high speeds and has a reduced circuit size as well.

FIG. 4 illustrates another exemplary configuration for the voltage holder circuit 50. The circuit configuration shown in FIG. 4 is almost the same as the one shown in FIG. 3. In FIG. 4, however, the cross-latched circuit section 53 receives not only the potential at the terminal node ND and the potential Vbias but also the output voltage of a level shifter 70 as well. The level shifter 70 shifts the level of the input signal CIN received at one terminal of the capacitor 20. Also, the second inverter circuit section 53b receives, at its input terminal, the output voltage of the level shifter 70, i.e., a signal obtained by shifting the level of the input signal CIN. This signal is substantially the same as the signal IN at the terminal node ND.

The voltage holder circuit 50 shown in FIG. 4 operates in almost the same way as the voltage holder circuit 50 shown in FIG. 3. In FIG. 4, however, the common gate of the transistors TR2, TR4 of the second inverter circuit section 53b is driven by the signal obtained by shifting the level of the input signal CIN, not the potential at the terminal node ND. As a result, the parasitic capacitance at the terminal node ND may be reduced so much as to allow the converter to operate at high speeds.

FIG. 5 illustrates another exemplary configuration for the voltage holder circuit 50. The voltage holder circuit 50 shown in FIG. 5 has substantially the same circuit configuration as its counterpart shown in FIG. 3. In FIG. 5, however, voltages VCLT and VCLB are applied as operating voltages to the cross-latched circuit section 53. A buffer 54 functioning as a first buffer circuit section is a voltage follower receiving the voltage VCLT and performs impedance transformation. A buffer 56 functioning as a second buffer circuit section is a voltage follower receiving the voltage VCLB and also performs impedance transformation. Resistors 55, 57 with high resistance are provided to allow a current to flow through the cross-latched circuit section 53.

The voltage holder circuit 50 shown in FIG. 5 operates in almost the same way as the voltage holder circuit 50 shown in FIG. 3. In FIG. 5, however, the cross-latched circuit section 53 operates between the voltages VCLT and VCLB. Thus, by controlling the voltages VCLT and VCLB, the voltage holding operation at the terminal node ND performed by the voltage holder circuit 50 may be controlled appropriately. Optionally, the circuit configuration shown in FIG. 5 may be used in combination with the circuit configuration shown in FIG. 4.

As can be seen from the foregoing description, according to this embodiment, the clamp circuit 40 defines the potential at the terminal node ND within the range of the potential VCLB to the potential VCLT. Also, the potential at the terminal node ND is raised by the voltage holder circuit 50 when higher than the voltage Vbias. On the other hand, when lower than the voltage Vbias, the potential at the terminal node ND is lowered by the voltage holder circuit 50. Thus, even if the capacitor 20 is gradually discharged while the converter is operating at a low rate or receiving a burst signal, the voltage holder circuit 50 may reduce the fall or rise in the potential at the terminal node ND. As a result, the amplitude of the signal IN may be maintained.

Second Embodiment

In the first embodiment described above, the signals are supposed to be single-ended signals. However, the present disclosure is also applicable to a configuration for converting the level of a differential signal pair.

Figure 6:
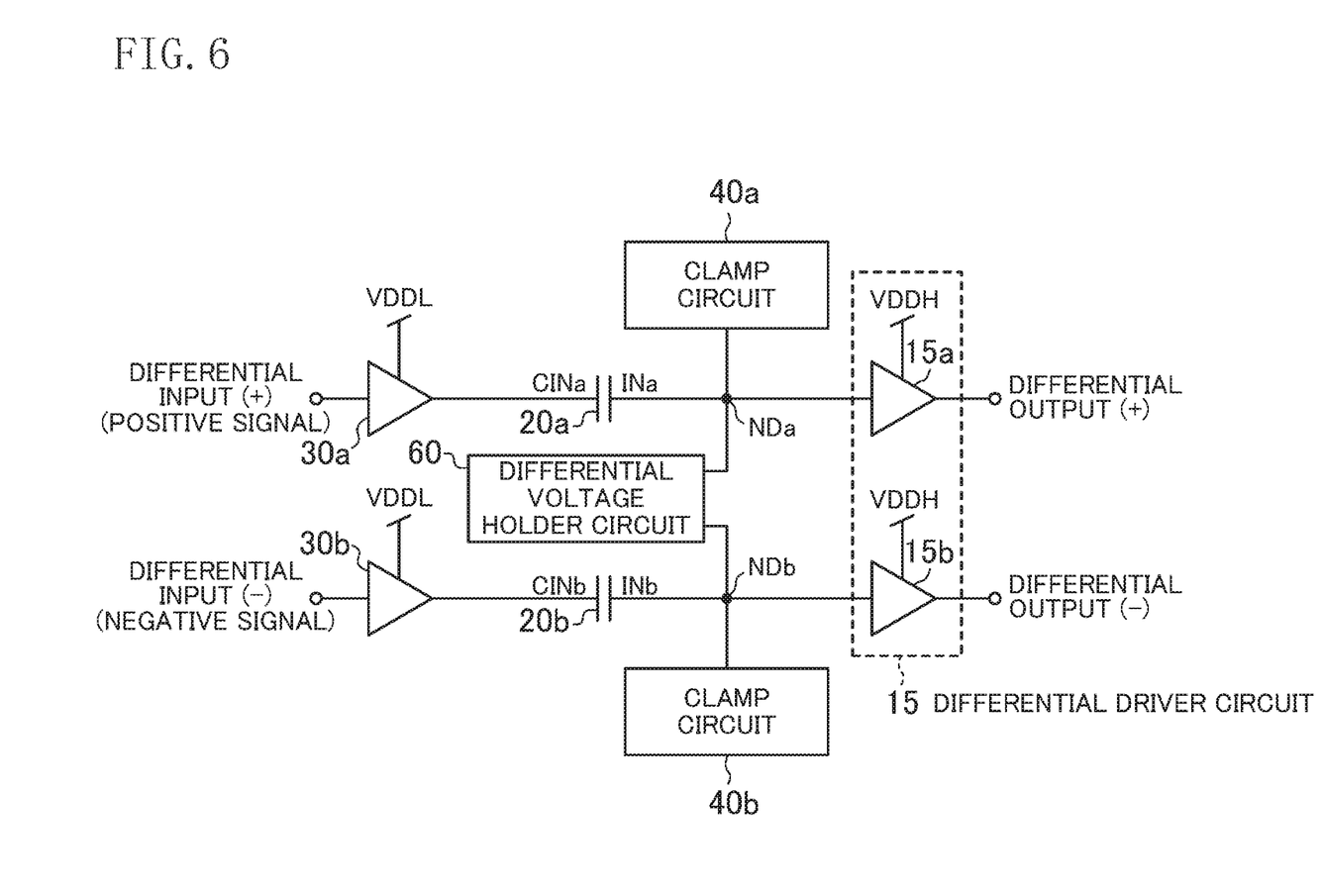
FIG. 6 illustrates a configuration for a signal potential converter according to a second embodiment.

FIG. 6 illustrates a circuit configuration for a signal potential converter according to a second embodiment and circuits preceding and following the converter. In the configuration shown in FIG. 6, a receiver circuit 15a, 15b, a capacitor 20a, 20b, a signal driver circuit 30a, 30b, and a clamp circuit 40a, 40b are provided for each of positive and negative signals that form a differential signal pair. A differential driver circuit 15 is formed by the receiver circuits 15a and 15b. A differential voltage holder circuit 60 is connected to a terminal node NDa of the positive signal and to a terminal node NDb of the negative signal. A signal potential converter according to this embodiment includes the capacitors 20a and 20b, the clamp circuits 40a and 40b, and the differential voltage holder circuit 60.

Figure 7:
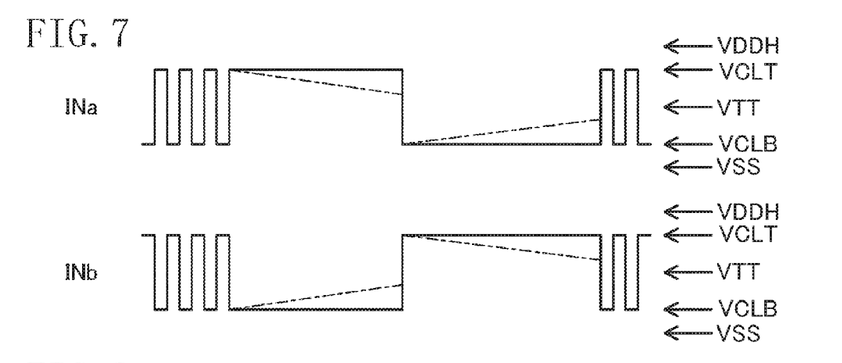
FIG. 7 is a timing chart illustrating how the signal potential converter shown in FIG. 6 operates.

FIG. 7 is a timing chart illustrating how the signal potential converter shown in FIG. 6 operates.

Each of the signal driver circuits 30a, 30b is supplied with a supply voltage VDDL and outputs a signal CINa, CINb, of which the amplitude is VDDL. The differential driver circuit 15 is supplied with a supply voltage VDDH and amplifies the potentials of the signal INa, INb, thereby generating a differential signal pair, of which the amplitude is VDDH.

The clamp circuit 40a raises the potential of the signal INa if the signal INa becomes lower than a potential VCLB, and lowers the potential of the signal INa if the signal INa becomes higher than a potential VCLT. Just like the clamp circuit 40 of the first embodiment, the clamp circuit 40a also includes a first connection element provided between the power supply VDDH and the terminal node NDa and a second connection element provided between the terminal node NDa and the power supply VSS. The impedance of the first connection element decreases when the potential at the terminal node NDa becomes lower than the potential VCLB. The impedance of the second connection element decreases when the potential at the terminal node NDa becomes higher than the potential VCLT.

Likewise, the clamp circuit 40b raises the potential of the signal INb if the signal INb becomes lower than the potential VCLB, and lowers the potential of the signal INb if the signal INb becomes higher than the potential VCLT. Just like the clamp circuit 40 of the first embodiment, the clamp circuit 40b also includes a first connection element provided between the power supply VDDH and the terminal node NDb and a second connection element provided between the terminal node NDb and the power supply VSS. The impedance of the first connection element decreases when the potential at the terminal node NDb becomes lower than the potential VCLB. The impedance of the second connection element decreases when the potential at the terminal node NDb becomes higher than the potential VCLT.

The differential voltage holder circuit 60 operates to raise the potential at the terminal node NDa and lower the potential at the terminal node NDb if the potential at the terminal node NDa (i.e., the potential of the signal INa) is higher than the potential at the terminal node NDb (i.e., the potential of the signal INb). On the other hand, if the potential at the terminal node NDa is lower than the potential at the terminal node NDb, the differential voltage holder circuit 60 operates to lower the potential at the terminal node NDa and raise the potential at the terminal node NDb.

Without the differential voltage holder circuit 60, if the converter is operating at a low rate or receiving a burst signal representing data that does not change for a long time, the signal level changes gradually as indicated by the one-dot chains in FIG. 7. The reason is that the electric charge stored in the capacitors 20a, 20b is lost little by little via elements connected to the capacitors 20a, 20b. As a result, the intended signal amplitude cannot be maintained and it is difficult to allow the converter to operate normally.

In contrast, according to this embodiment, the differential voltage holder circuit 60 operates so as to reduce the change in the signal level. Also, even in a situation where the differential voltage holder circuit 60 is operating to raise the potential at the terminal node NDa and lower the potential at the terminal node NDb, once the potential at the terminal node NDa reaches the potential VCLT, the potential VCLT will be maintained after that by the clamp circuit 40a. Likewise, once the potential at the terminal node NDb reaches the potential VCLB, the potential VCLB will be maintained after that by the clamp circuit 40b.

As can be seen, in a configuration for converting the level of a differential signal pair according to this embodiment, the converter may also operate normally even while operating at a low rate or receiving a burst signal. Thus, the converter may operate both at high speeds and at low speeds depending on the situation.

Figure 8:
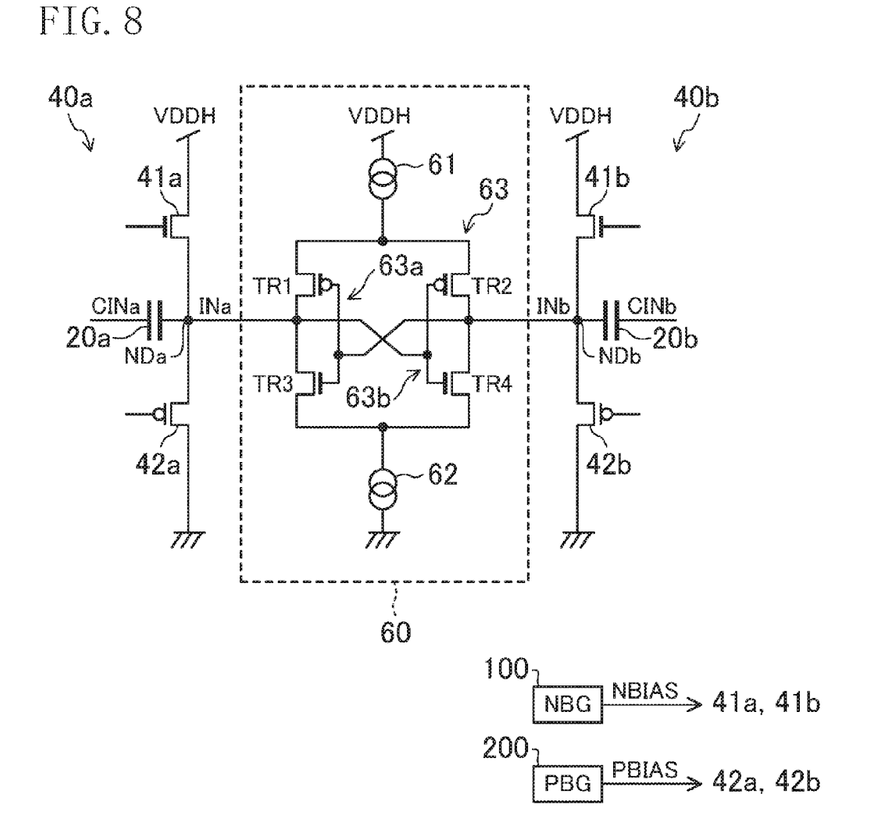
FIG. 8 illustrates an exemplary configuration for the differential voltage holder circuit shown in FIG. 6.
Figure 9:
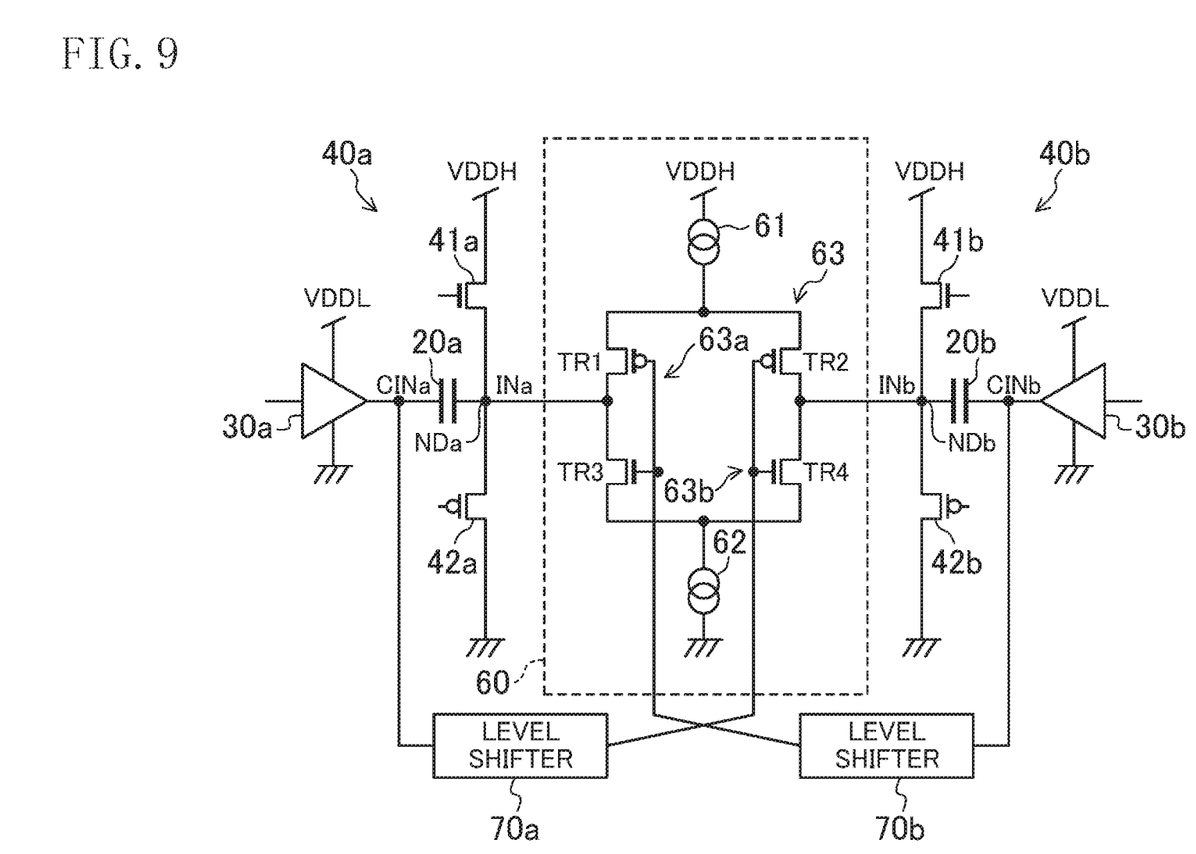
FIG. 9 illustrates another exemplary configuration for the differential voltage holder circuit shown in FIG. 6.
Figure 10:
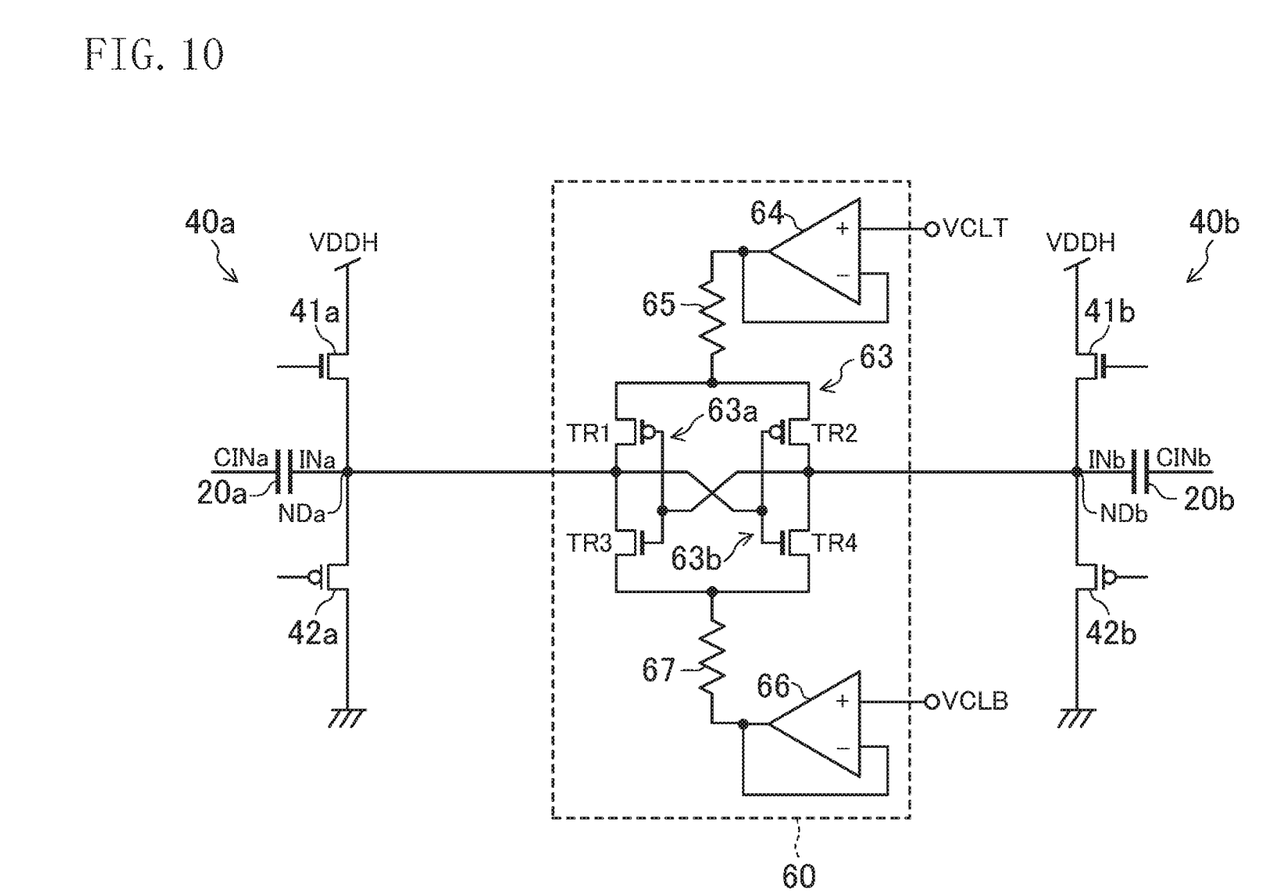
FIG. 10 illustrates still another exemplary configuration for the differential voltage holder circuit shown in FIG. 6.

FIG. 8 illustrates an exemplary configuration for the differential voltage holder circuit 60 shown in FIG. 6. In FIGS. 8-10, the configuration and operation of the clamp circuits 40a, 40b are substantially the same as those of the clamp circuit 40 shown in FIG. 3 and other drawings, and detailed description thereof will be omitted herein. The clamp circuit 40a includes an NMOS transistor 41a functioning as a first connection element and a PMOS transistor 42a functioning as a second connection element. The clamp circuit 40b includes an NMOS transistor 41b functioning as a third connection element and a PMOS transistor 42b functioning as a fourth connection element. Also, in the configuration shown in FIG. 8, the clamp circuits 40a, 40b share control potential generator circuits 100, 200 for generating control potentials NBIAS and PBIAS. However, each of the clamp circuits 40a, 40b may have their own control potential generator circuits 100, 200.

The differential voltage holder circuit 60 shown in FIG. 8 includes: a first current source 61 connected to the power supply VDDH; a second current source 62 connected to the ground power supply VSS; and a cross-latched circuit section 63 provided between the first and second current sources 61, 62. The cross-latched circuit section 63 receives the potential at the terminal node NDa and the potential at the terminal node NDb.

The cross-latched circuit section 63 includes PMOS transistors TR1, TR2 and NMOS transistors TR3, TR4. The PMOS transistor TR1 and the NMOS transistor TR3 have their respective gates connected in common and their respective drains connected in common, thus forming a first inverter circuit section 63a. The PMOS transistor TR2 and the NMOS transistor TR4 have their respective gates connected in common and their respective drains connected in common, thus forming a second inverter circuit section 63b. The common gate and common drain of the PMOS and NMOS transistors TR1, TR3 respectively correspond to input and output terminals of the first inverter circuit section 63a. The common gate and common drain of the PMOS and NMOS transistors TR2, TR4 respectively correspond to input and output terminals of the second inverter circuit section 63b. The output terminal of the first inverter circuit section 63a and the input terminal of the second inverter circuit section 63b are connected to the terminal node NDa. The input terminal of the first inverter circuit section 63a and the output terminal of the second inverter circuit section 63b are connected to the terminal node NDb.

Next, it will be described how the differential voltage holder circuit 60 shown in FIG. 8 operates. If the potential at the terminal node NDa (i.e., the potential of the signal INa) is higher than the potential at the terminal node NDb (i.e., the potential of the signal INb), the PMOS and NMOS transistors TR1, TR4 become conductive, whereas the PMOS and NMOS transistors TR2, TR3 become non-conductive. In this case, a current flows from the power supply VDDH toward the terminal node NDa via the PMOS transistor TR1. This current serves to retain the electric charge stored in the capacitor 20a and raise the potential at the terminal node NDa. As a result, the potential of the signal INa may be kept from falling. In addition, at this time, a current also flows from the terminal node NDb toward the ground power supply VSS via the NMOS transistor TR4. This current serves to retain the electric charge stored in the capacitor 20b and lower the potential at the terminal node NDb. As a result, the potential of the signal INb may be kept from rising.

On the other hand, if the potential at the terminal node NDa (i.e., the potential of the signal INa) is lower than the potential at the terminal node NDb (i.e., the potential of the signal INb), the PMOS and NMOS transistors TR1, TR4 become non-conductive, whereas the PMOS and NMOS transistors TR2, TR3 become conductive. In this case, a current flows from the terminal node NDa toward the ground power supply VSS via the NMOS transistor TR3. This current serves to retain the electric charge stored in the capacitor 20a and lower the potential at the terminal node NDa. As a result, the potential of the signal INa may be kept from rising. In addition, at this time, a current also flows from the power supply VDDH toward the terminal node NDb via the PMOS transistor TR2. This current serves to retain the electric charge stored in the capacitor 20b and lower the potential at the terminal node NDb. As a result, the potential of the signal INb may be kept from falling.

As can be seen, the differential voltage holder circuit 60 shown in FIG. 8 operates to raise the potential at the terminal node NDa and lower the potential at the terminal node NDb if the potential at the terminal node NDa is higher than the potential at the terminal node NDb. The differential voltage holder circuit 60 also operates to lower the potential at the terminal node NDa and raise the potential at the terminal node NDb if the potential at the terminal node NDa is lower than the potential at the terminal node NDb. On top of that, this differential voltage holder circuit 60 may also switch at high speeds and has a reduced circuit size as well.

FIG. 9 illustrates another exemplary configuration for the differential voltage holder circuit 60. The circuit configuration shown in FIG. 9 is almost the same as the one shown in FIG. 8. In FIG. 9, however, the cross-latched circuit section 63 receives not only the potentials at the terminal nodes NDa, NDb but also the output voltages of level shifters 70a, 70b as well. The level shifter 70a shifts the level of the input signal CINa received at one terminal of the capacitor 20a. The level shifter 70b shifts the level of the input signal CINb received at one terminal of the capacitor 20b. Also, the first inverter circuit section 63a receives, at its input terminal, the output voltage of the level shifter 70b, i.e., a signal obtained by shifting the level of the input signal CINb. This signal is substantially the same as the signal INb at the terminal node NDb. The second inverter circuit section 63b receives, at its input terminal, the output voltage of the level shifter 70a, i.e., a signal obtained by shifting the level of the input signal CINa. This signal is substantially the same as the signal INa at the terminal node NDa.

The differential voltage holder circuit 60 shown in FIG. 9 operates in almost the same way as the differential voltage holder circuit 60 shown in FIG. 8. In FIG. 9, however, the common gate of the transistors TR1, TR3 of the first inverter circuit section 63a is driven by the signal obtained by shifting the level of the input signal CINb, not the potential at the terminal node NDb. Also, the common gate of the transistors TR2, TR4 of the second inverter circuit section 63b is driven by the signal obtained by shifting the level of the input signal CINa, not the potential at the terminal node NDa. As a result, the parasitic capacitance at the terminal nodes NDa, NDb may be reduced so much as to allow the converter to operate at high speeds.

FIG. 10 illustrates another exemplary configuration for the differential voltage holder circuit 60. The differential voltage holder circuit 60 shown in FIG. 10 has substantially the same circuit configuration as its counterpart shown in FIG. 8. In FIG. 10, however, voltages VCLT and VCLB are applied as operating voltages to the cross-latched circuit section 63. A buffer 64 functioning as a first buffer circuit section is a voltage follower receiving the voltage VCLT and performs impedance transformation. A buffer 66 functioning as a second buffer circuit section is a voltage follower receiving the voltage VCLB and also performs impedance transformation. Resistors 65, 67 with high resistance are provided to allow a current to flow through the cross-latched circuit section 63.

The differential voltage holder circuit 60 shown in FIG. 10 operates in almost the same way as the differential voltage holder circuit 50 shown in FIG. 8. In FIG. 10, however, the cross-latched circuit section 63 operates between the voltages VCLT and VCLB. Thus, by controlling the voltages VCLT and VCLB, the voltage holding operation at the terminal nodes NDa, NDb performed by the differential voltage holder circuit 60 may be controlled appropriately. Optionally, the circuit configuration shown in FIG. 10 may be used in combination with the circuit configuration shown in FIG. 9.

As can be seen from the foregoing description, even a configuration for shifting the level of a differential signal pair according to this embodiment also have the same or similar advantages as/to the first embodiment. Specifically, the clamp circuits 40a, 40b define the potentials at the terminal nodes NDa, NDb within the range of the potential VCLB to the potential VCLT. Also, if the potential at the terminal node NDa is higher than the potential at the terminal node NDb, the differential voltage holder circuit 60 raises the potential at the terminal node NDa and lowers the potential at the terminal node NDb. On the other hand, if the potential at the terminal node NDa is lower than the potential at the terminal node NDb, the differential voltage holder circuit 60 lowers the potential at the terminal node NDa and raises the potential at the terminal node NDb. Thus, even if the capacitors 20*a*, 20*b* are gradually discharged while the converter is operating at a low rate or receiving a burst signal, the differential voltage holder circuit 60 may also reduce the fall or rise in the potentials at the terminal nodes NDa, NDb. As a result, the amplitude of the differential signal pair INa, INb may be maintained.

A signal potential converter according to the present disclosure may operate at high speeds and may also maintain the amplitude of a signal even while operating at a low rate or receiving a burst signal, and may be used effectively in an interface circuit for a hybrid core, for example.

What is claimed is:

1. A signal potential converter comprising:
a first capacitor, one terminal of which receives a positive signal that is one of two signals forming a differential signal pair and the other terminal of which is connected to a first terminal node;
a first clamp circuit configured to receive a potential at the first terminal node;
a second capacitor, one terminal of which receives a negative signal that is the other of the two signals forming the differential signal pair and the other terminal of which is connected to a second terminal node;
a second clamp circuit configured to receive a potential at the second terminal node; and
a differential voltage holder circuit connected to the first and second terminal nodes, wherein
the first clamp circuit includes:
a first connection element provided between a first power supply and the first terminal node; and
a second connection element provided between the first terminal node and a second power supply having a lower supply voltage than the first power supply,
the impedance of the first connection element decreases when the potential at the first terminal node becomes lower than a first potential that is higher than the supply voltage of the second power supply,
the impedance of the second connection element decreases when the potential at the first terminal node becomes higher than a second potential that is lower than the supply voltage of the first power supply and higher than the first potential,
the second clamp circuit includes:
a third connection element provided between the first power supply and the second terminal node; and
a fourth connection element provided between the second terminal node and the second power supply,
the impedance of the third connection element decreases when the potential at the second terminal node becomes lower than the first potential,
the impedance of the fourth connection element decreases when the potential at the second terminal node becomes higher than the second potential,
the differential voltage holder circuit operates to raise the potential at the first terminal node and lower the potential at the second terminal node if the potential at the first terminal node is higher than the potential at the second terminal node, and operates to lower the potential at the first terminal node and raise the potential at the second terminal node if the potential at the first terminal node is lower than the potential at the second terminal node.

2. The signal potential converter of claim 1, wherein the differential voltage holder circuit includes:
a first current source connected to the first power supply;
a second current source connected to the second power supply; and
a cross-latched circuit section including first and second inverter circuit sections that are arranged in parallel with each other between the first and second current sources, and
an output terminal of the first inverter circuit section and an input terminal of the second inverter circuit section are connected to the first terminal node, and
an input terminal of the first inverter circuit section and an output terminal of the second inverter circuit section are connected to the second terminal node.

3. The signal potential converter of claim 1, wherein the differential voltage holder circuit includes:
a first buffer circuit section configured to supply the second potential;
a second buffer circuit section configured to supply the first potential; and
a cross-latched circuit section including first and second inverter circuit sections that are arranged in parallel with each other between the first and second buffer circuit sections, and
an output terminal of the first inverter circuit section and an input terminal of the second inverter circuit section are connected to the first terminal node, and
an input terminal of the first inverter circuit section and an output terminal of the second inverter circuit section are connected to the second terminal node.

4. The signal potential converter of claim 1, wherein the differential voltage holder circuit includes:
a first current source connected to the first power supply;
a second current source connected to the second power supply; and
a cross-latched circuit section including first and second inverter circuit sections that are arranged in parallel with each other between the first and second current sources, and
an output terminal of the first inverter circuit section is connected to the first terminal node, and
an output terminal of the second inverter circuit section is connected to the second terminal node, and
an input terminal of the first inverter circuit section receives a signal obtained by shifting a level of the negative signal, and
an input terminal of the second inverter circuit section receives a signal obtained by shifting a level of the positive signal.

5. The signal potential converter of claim 1, wherein the first connection element is a first NMOS transistor, of which drain and source are connected to the first power supply and the first terminal node, respectively,
the third connection element is a second NMOS transistor, of which drain and source are connected to the first power supply and the second terminal node, respectively, and
the first and second clamp circuits share control potential generator circuits configured to generate control potentials to be applied to respective gates of the first and second NMOS transistors.

6. The signal potential converter of claim 1, wherein the second connection element is a first PMOS transistor, of which drain and source are connected to the second power supply and the first terminal node, respectively,
the fourth connection element is a second PMOS transistor, of which drain and source are connected to the second power supply and the second terminal node, respectively, and the first and second clamp circuits share control potential generator circuits configured to generate control potentials to be applied to respective gates of the first and second PMOS transistors.

7. The signal potential converter of claim 1, wherein the differential voltage holder circuit includes:
a first buffer circuit section configured to supply the second potential;
a second buffer circuit section configured to supply the first potential; and
a cross-latched circuit section including first and second inverter circuit sections that are arranged in parallel with each other between the first and second buffer circuit sections, and
an output terminal of the first inverter circuit section is connected to the first terminal node, and
an output terminal of the second inverter circuit section is connected to the second terminal node, and
an input terminal of the first inverter circuit section receives a signal obtained by shifting a level of the negative signal, and
an input terminal of the second inverter circuit section receives a signal obtained by shifting a level of the positive signal.

* * * * *